United States Patent
Nojima

[19]

[11] Patent Number: 5,978,072
[45] Date of Patent: *Nov. 2, 1999

[54] EXPOSURE APPARATUS

[75] Inventor: Yawara Nojima, Narashino, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/864,854

[22] Filed: May 29, 1997

[30] Foreign Application Priority Data

May 29, 1996 [JP] Japan ................................. 8-158945

[51] Int. Cl.$^6$ .......................... G03B 27/72; G03B 27/42; H01L 21/30
[52] U.S. Cl. ................................. 355/71; 355/53; 355/67
[58] Field of Search .................................. 355/53, 67, 71

[56] References Cited

U.S. PATENT DOCUMENTS 5,335,044  8/1994  Shiraishi ..................................... 355/53
5,661,546  8/1997  Taniguchi .

FOREIGN PATENT DOCUMENTS 5-175100  7/1993  Japan .

Primary Examiner—Alan A. Mathews
Attorney, Agent, or Firm—Nixon & Vanderhye P.C.

[57] ABSTRACT

An exposure apparatus illuminates a mask with exposure light emitted from an illumination optical system and projects a mask pattern image that is formed when the exposure light passes through the mask onto a photosensitive substrate. The illumination optical system includes an optical element for making the intensity distribution of exposure light emitted from the light source uniform, and aperture stops are interchangeably positioned directly behind the optical element. The illumination optical system additionally includes an adjusting mechanism that adjusts the positions and the inclination of the optical element and the aperture stops in the direction along the optical axis in directions perpendicular to the optical axis, and with respect to the inclination from the optical axis. Thus, the positional relationship between the optical element and the aperture stops can be kept constant, and as a result, the exposure accuracy of an exposure apparatus can be improved.

29 Claims, 3 Drawing Sheets

EXPOSURE APPARATUS

BACKGROUND OF THE INVENTION

This invention relates to an exposure apparatus and, more particularly, to a projection exposure apparatus including an adjustable holder mechanism that controllably adjusts positions of an optical element and a plurality of aperture stops relative to each other and to the optical axis.

When manufacturing, for example, a semiconductor integrated circuit or liquid crystal substrate using a lithography technique, a resist film formed on a sample substrate is exposed into a predetermined pattern. In this exposure process, a projection exposure apparatus is generally used.

A projection exposure apparatus illuminates a reticle (mask), on which a prescribed circuit pattern is formed, with illumination light emitted from a light source. When the illumination light passes through the reticle, an image of the reticle pattern is formed. The reticle pattern image is projected through a projection optical system onto the resist film on the sample substrate. Thus, the resist film is exposed into the prescribed circuit pattern.

Recently, in connection with this type of projection exposure apparatus, many proposals have been made to make uniform an intensity distribution of illumination light that is guided to the reticle. For example, it has been proposed to provide an optical element called a fly-eye lens in the optical path of illumination light between the light source and the reticle. Japanese patent application laid-open No. 5-175100 discloses aperture stops positioned directly behind the fly-eye lens in an interchangeable manner, and one of the aperture stops is selected as necessary to chance the illumination condition of illumination light guided to the reticle.

However, in the prior art, even if a fly-eye lens is provided in the illumination optical system, which extends from the light source to the reticle, and even if interchangeable aperture stops are positioned immediately after the fly-eye lens, there is no consideration given to the positional relationship between the fly-eye lens and the aperture stop.

In recent years, improved exposure accuracy is demanded as the exposure pattern becomes smaller. To this end, it becomes necessary to maintain the stability of the positional relationship between the fly-eye lens and the aperture stop.

SUMMARY OF THE INVENTION

The present invention was conceived in view of this point, and it is an object of the invention to provide an exposure apparatus that can improve the exposure accuracy with a simple structure. It is another object of the present invention to provide an exposure apparatus and method that can maintain the stability of the positional relationship between the optical element and the aperture stop.

To achieve the object, a mask is illuminated by exposure light emitted from a light source of an illumination optical system. A pattern image of the mask, which is obtained when the exposure light passes through the mask, is projected and formed onto a photosensitive substrate through a projection optical system. Thus, the photosensitive substrate is exposed into the mask pattern. The illumination optical system includes an optical element for making uniform an intensity distribution of the exposure light emitted from the light source, aperture stops positioned directly behind the optical element, and an adjusting mechanism for adjusting positions of the optical element and the aperture stops with respect to, for example, the optical-axis direction (Z direction), the directions perpendicular to the optical axis (X and Y directions) and inclinations from the optical axis.

The positional relationship between the optical element and one of the aperture stops, through which exposure light passes, is always kept constant through the adjustment mechanism.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

An embodiment of the invention will now be described in conjunction with the attached drawings.

(1) First Embodiment

Figure 1:
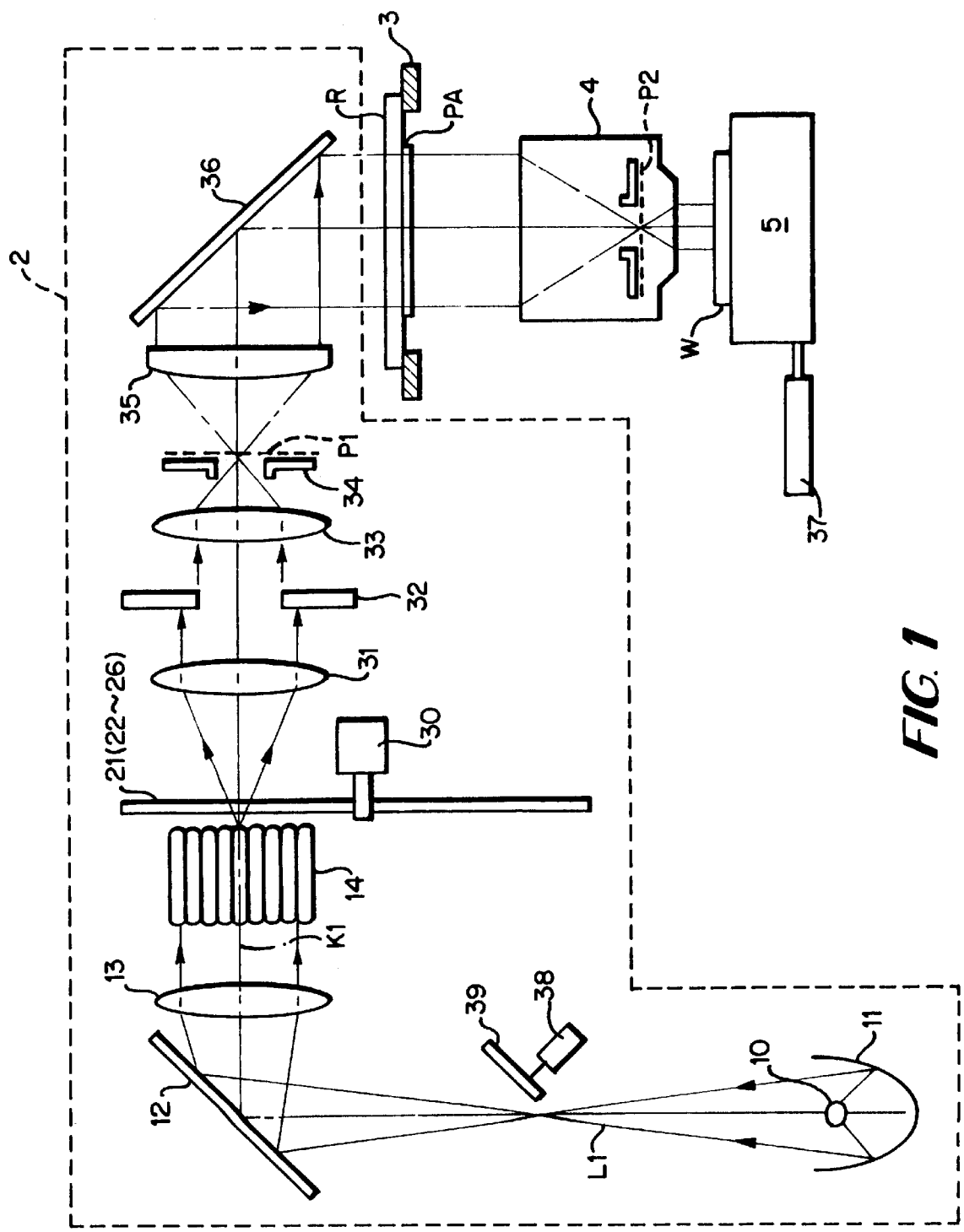
FIG. 1 is a schematic diagram showing the structure of the projection exposure apparatus to which the present invention is applied.

FIG. 1 illustrates a projection exposure apparatus to which the invention is applied. Exposure light L1 emitted from an illumination optical system 2 illuminates a reticle R, which is held by a reticle holder 3. When the exposure light L1 passes through the reticle pattern PA of the reticle R, a pattern image of the reticle pattern PA is obtained. The reticle pattern image is projected through a projection optical system 4 and formed onto a resist film on a wafer W, which is mounted on a wafer holder 5, thereby exposing the resist film of the wafer W into the reticle pattern PA.

In the illumination optical system of the projection exposure apparatus 1, exposure light L1 emitted from a light source (e.g., a mercury-vapor lamp) 10 of the illumination optical system 2 is collected by an elliptical mirror 11. The exposure light L1 is then guided via a second mirror 12 to an input lens 13, which collimates the exposure light L1 to produce parallel luminous flux. The intensity distribution of the exposure light L1 is made uniform by a fly-eye lens 14.

A shielding plate 39 is positioned in the vicinity of the convergent point of the exposure light L1 that is collected by the elliptical mirror 11. The shielding plate 39 is held by a motor 38 in a rotatable manner. The motor 38 moves the shielding plate 39 into the convergent point of the exposure light L1, as necessary, to block illumination of the exposure light L1 onto the wafer W.

Figure 2:
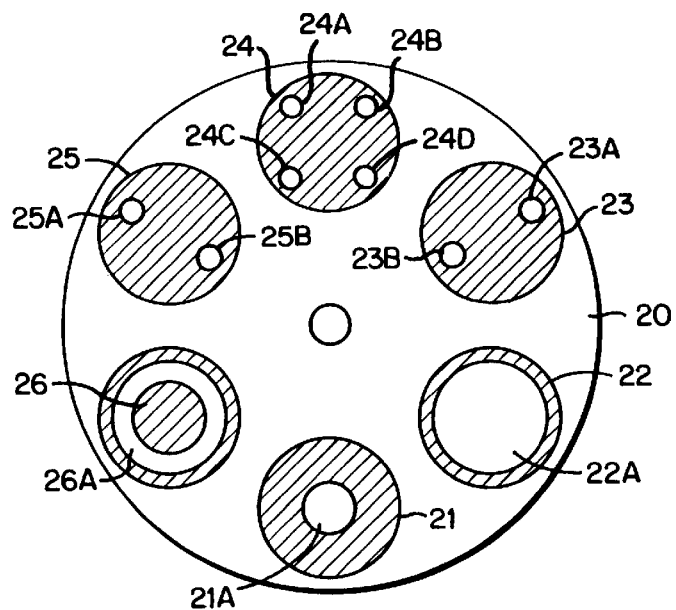
FIG. 2 is a front view of a rotational plate having a plurality of different types of aperture stops.

A rotational plate 20, on which a plurality of aperture stops 21–26 are concentrically formed at even intervals, is positioned in the focal plane behind the fly-eye lens 14. (The focal plane corresponds to the Fourier-transformation plane of the reticle patten PA within the illumination optical system 2.) The aperture stops 21–26 have different types of apertures (21A), (22A, 23A), (23B), (24A–24D), (25A, 25B) and (26A), respectively, as shown in FIG. 2.

In the projection exposure apparatus 1, an aperture stop that faces the exit plane of the fly-eye lens 14 is selected among the aperture stops 21–26 by rotating the rotational plate 20 a predetermined amount through a motor 30, thereby changing the exposure condition to the resist film on the wafer W.

Exposure light L1 that exits from the rotational plate 20 is converted into parallel luminous flux by an output lens 31, and enters a relay lens 33 through a field stop 32 that is disposed at a conjugate position with respect to the reticle pattern PA of the reticle R. The exposure light L1 is converged through the relay lens 33 onto a plane P1 that is conjugate with one of the aperture stops 21–26 on the rotational plate 20.

The exposure light L1 then enters a condenser lens 35 through a variable aperture stop 34, which is positioned on the conjugate plane P1. The condenser lens 35 makes the exposure light L1 parallel, whereby parallel luminous flux illuminates the reticle R via a third mirror 36.

When the exposure light L1 passes through the pattern plane of the reticle R, an image of the reticle pattern PA is formed. The reticle pattern image is collected onto a pupil plane P2 of the optical system 4, and projected onto the resist film of the wafer W, which is mounted on the wafer stage 5.

The wafer stage 5 is moved by a driving motor 37 in the direction along the optical axis of the exposure light L1 and in the direction perpendicular to the optical axis, as necessary. In this way, the projection exposure apparatus 1 exposes the resist film of the wafer W into the reticle pattern PA to form a latent image of the reticle pattern PA on the resist film.

Figure 3:
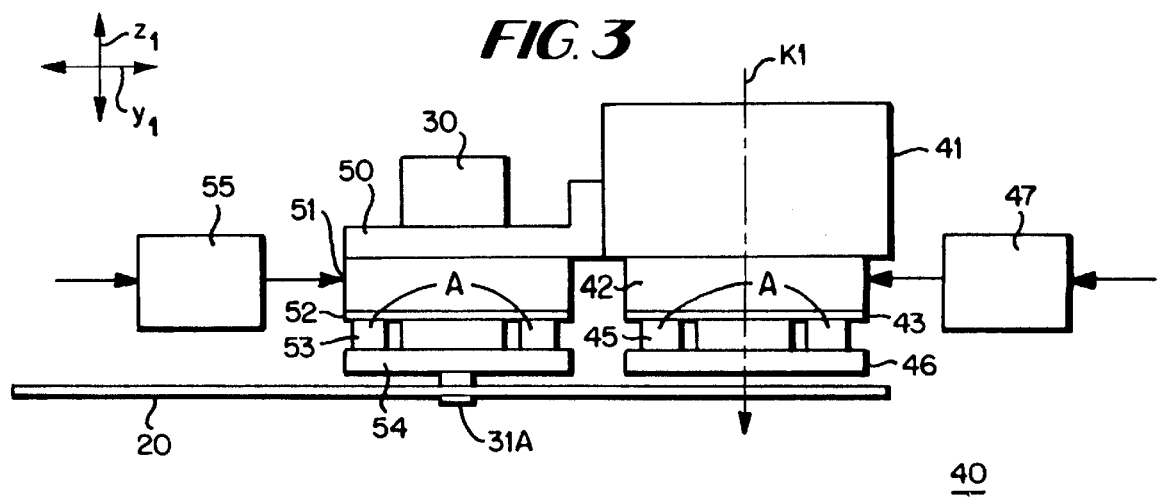
FIG. 3 is a side view of the adjustable holder mechanism according to a first embodiment of the invention.

In the projection exposure apparatus 1, the fly-eye lens 14 and the rotational plate 20 are held together by an adjustable holder mechanism 40 as shown in FIG. 3. The adjustable holder mechanism 40 has a base 41 for fixing the fly-eye lens 14 and the rotational plate 20 in predetermined positions. A stage 43 is attached to the base 41 through a first XYZ mechanism 42.

A fly-eye lens holder 46 is attached to the stage 43 through a first swing mechanism 45, which is composed of a piezoelectric element. The fly-eye lens holder 46 holds the fly-eye lens 14 (FIG. 1) so that the optical axis of the fly-eye lens 14 is parallel to the optical axis K1 of the exposure light L1.

The first XYZ mechanism 42 moves the stage 43 by a necessary amount in the Z direction (indicated by the arrow z,) parallel to the optical axis K1, and in the X and Y directions, which are perpendicular to the optical axis and orthogonal to each other, based on the driving force of the first driving unit 47, which corresponds to a control signal supplied from the control system (not shown) to the first driving unit 47.

The first swing mechanism 45 adjusts the inclination (swing) of the fly-eye lens holder 46 with respect to the optical axis K1 of the exposure light L1 based on the control signal supplied from the control system mentioned above.

Thus, the adjustable holder mechanism 40 changes the X, Y and Z positions of the fly-eye lens holder 46 through the first XYZ mechanism 42, while changing the inclination of the fly-eye lens holder 46 through the first swing adjusting mechanism 45, thereby adjusting the X, Y and Z positions and the inclination of the fly-eye lens 14.

A second XYZ mechanism 51 is also attached to the base 41 through a coupling plate 50 having an L-shaped cross-section. The second XYZ mechanism 51 holds a second swing adjusting mechanism 53, which is composed of a piezoelectric element, through the stage 52.

The motor 30 mentioned above is fixed to the second swing adjusting mechanism 53 through a motor-attachment block 54 with the output shaft 31A thereof parallel to the Z direction. The rotational plate 20 (FIG. 2) is fixed to the output shaft 31A of the motor 30.

The second XYZ mechanism 51 moves the stage 53 by a necessary amount in the Z direction parallel to the optical axis K1, and X and Y directions, based on the driving force of a second driving unit 55. The driving force corresponds to a control signal supplied from the control system (not shown) to the second driving unit 55. The second swing mechanism 53 changes the inclination (swing) of the motor-attachment block 54 with respect to the optical axis K1 of the exposure light L1 based on the control signal supplied from the control system.

Thus, the adjustable holder mechanism 40 changes the X, Y and Z positions of the rotational plate 20 through the second XYZ mechanism 51, while changing the inclination of the rotational plate 20 through the second swing adjusting mechanism 53, thereby adjusting the X, Y and Z positions and the inclination of the aperture stops 21–26 of the rotational plate 20.

The motor 30 rotates the rotational plate 20 based on the driving control signal supplied from the control system to select and change the aperture stop among the aperture stops 21–26, so that the selected aperture stop faces the exit plane of the fly-eye lens 14.

The X, Y and Z positions and inclination of the fly-eye lens 14 are adjusted by driving the first XYZ mechanism 42 and the first swing adjusting mechanism 45 of the adjustable holder mechanism 40. Then, the X, Y and Z positions and inclination of the aperture stops 21–26 are adjusted by driving the second XYZ mechanism 51 and the second swing adjusting mechanism 53 of the adjustable holder mechanism 40. The details of the structure effecting position adjustment by the first and second XYZ mechanisms 42, 51 and by the first and second swing mechanisms 45, 53 would be apparent to those of ordinary skill in the art, and further description herein is omitted.

Because the position and inclination of the selected aperture stop are adjusted with reference to the position and inclination of the fly-eye lens 14 after the fly-eye lens 14 is adjusted by the first XYZ mechanism 42 and the first swing adjusting mechanism 45, the relative positional relationship between the fly-eye lens 14 and the associated aperture stop selected among the aperture stops 21–26 can be maintained.

The fly-eye lens 14 is attached to the base 41 through the first XYZ mechanism 42 and the first swing adjusting mechanism 45, while the rotational plate 20 is rotatably attached to the base 41 through the second XYZ mechanism 51 and the second swing adjusting mechanism 53. Each of the aperture stops 21–26 provided on the rotational plate 20 can be respectively interchangeably positioned on the optical axis K1, and the relative relationship between the position of the selected aperture stop and the position of the fly-eye lens 14 is kept constant. Thus, the exposure accuracy of the apparatus can be improved.

(2) Second Embodiment

Figure 4:
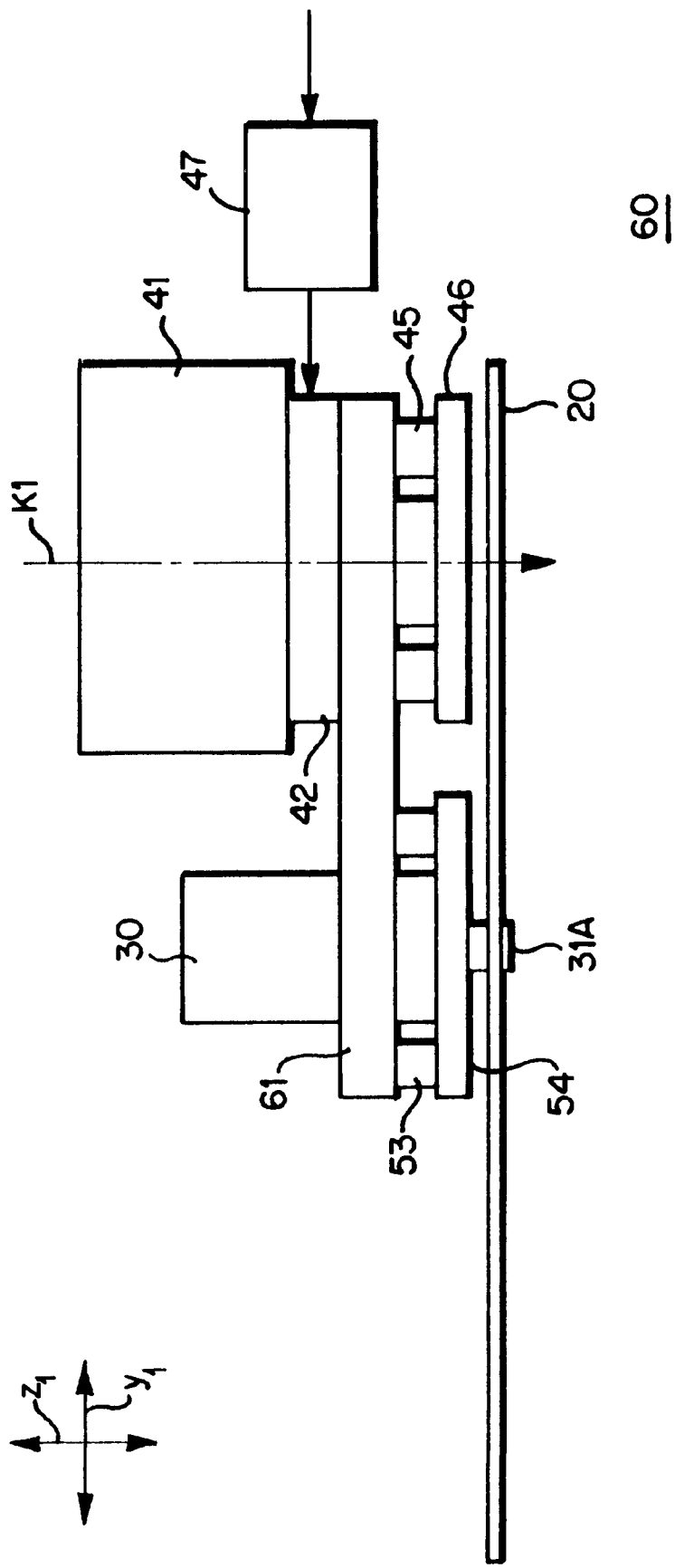
FIG. 4 is a side view of the adjustable holder mechanism according to a second embodiment of the invention.

FIG. 4 illustrates an adjustable holder mechanism 60 according to a second embodiment, which is used in the projection exposure apparatus 1 in place of the adjustable holder mechanism 40 of the first embodiment. A plate block 61 is attached to the base 41 through the first XYZ mechanism 42.

The fly-eye holder 46 is fixed to one end of the block 61 through the first swing adjusting mechanism 45. A motor-attachment block 54 is fixed to the other end of the block 61 through the second swing adjusting mechanism 53. The motor 30 is fixed to the motor-attachment block 54 with the output shaft 31A parallel to the Z direction. The rotational plate 20 is fixed to the output shaft 31A of the motor 30.

The first XYZ mechanism 42 moves the block 61 in the Z direction parallel to the optical axis K1 and X and Y directions, which are perpendicular to the optical axis and orthogonal to each other, based on the driving force of the first driving unit 47, which is determined by a control signal supplied from the control system (not shown) to the first driving unit 47.

The adjustable holder mechanism 60 moves the fly-eye lens holder 46 and the rotational plate 20 together in the X, Y and Z directions by driving the first XYZ mechanism 42. Because the fly-eye lens holder 46 and the rotational plate 20 are fixed to the same block 61 in a predetermined positional relationship, the X, Y and Z positions of the fly-eye lens 14 and the aperture stops 21–26 are adjusted simultaneously.

The first swing mechanism 45 changes the inclination (swing) of the fly-eye lens holder 46 with respect to the optical axis K1, based on the control signal supplied from the control system. The second swing mechanism 53 changes the inclination (swing) of the block 54 with respect to the Z direction based on the control signal supplied from the control system. Thus, the adjustable holder mechanism 60 changes the inclination of the fly-eye lens 14 and the rotational plate 20 independently through the first and second swing adjusting mechanisms 45 and 53, respectively.

By incorporating the adjustable holder mechanism 60 into the projection exposure apparatus 1 (FIG. 1), a positional relationship between the fly-eye lens 14 and the selected aperture stop 21–26 is kept constant, similar to the first embodiment. Moreover, adjustment of the fly-eye lens 14 and the aperture stops 21–26 along the X, Y and Z directions can be carried out simultaneously because the fly-eye lens 14 and the rotational plate 20 are fixed to the block 61 in a predetermined positional relationship. This arrangement facilitates positional adjustment of the fly-eye lens 14 and the aperture stops 21–26, as compared with the adjustable holder mechanism 40 of the first embodiment shown in FIG. 3.

(3) Others

Although the present invention has been described in conjunction with the first and second embodiments in which the invention is applied to a projection exposure apparatus 1 for exposing a wafer W, the invention is not limited to these applications. The invention can be applied to any exposure apparatus that is designed to illuminate a mask using exposure light emitted from an illumination optical system to project a mask pattern image onto a photosensitive substrate.

In the first and second embodiments, the fly-eye lens 14 is used as the optical element that makes the intensity distribution of exposure light emitted from the light source uniform. However, various types of optical elements can be used instead of the fly-eye lens 14.

Although the rotational plate 20 in which a plurality of aperture stops 21–26 are provided is used to interchangeably select one of the aperture stops 21–26, there are many other arrangements for changing the aperture stops 21–26, and the invention is not meant to be limited to the described and illustrated arrangement.

In the first and second embodiments, the adjustment mechanism for adjusting the positions and the inclination of the fly-eye lens 14 and the aperture stops 21–26 is constituted as the adjustable holder mechanisms 40 and 60 shown in FIGS. 3 and 4, respectively. However, various structures can be adapted as long as the positions and the inclination of the fly-eye lens 14 and the aperture stops 21–26 are adjusted along the optical-axis direction (Z direction), which passes through the fly-eye lens 14 and the selected one of the aperture stops 21–26, in directions perpendicular to the optical axis K1 (X and Y directions) and in a swing direction (inclination) with respect to the optical axis K1.

In the second embodiment, the position adjusting mechanism (the first XYZ mechanism 42) is used in common for adjusting the X, Y and Z positions of the fly-eye lens 14 and the aperture stops 21–26. However, the positional adjustment in fewer than all of the X, Y and Z directions may be performed for the fly-eye lens 14 and the aperture stops 21–26. Alternatively, in addition to the positional adjustment in the X, Y and Z directions, the adjusting mechanism (the first or second swing adjusting mechanism 45 or 53) for adjusting the inclination may also be commonly used for the fly-eye lens 14 and the aperture stops 21–26.

As has been described above, the present invention is applied to an exposure apparatus that illuminates a mask with exposure light emitted from an illumination optical system and projects a mask pattern image, which is formed when the exposure light passes through the mask, onto a photosensitive substrate. The illumination optical system includes an optical element for making the intensity distribution of exposure light emitted from the light source uniform, and aperture stops interchangeably positioned directly behind the optical element. The illumination optical system further includes an adjusting mechanism that adjusts the positions and the inclination of the optical element and the aperture stops in the direction along the optical axis, in the directions perpendicular to the optical axis, and with respect to the inclination from the optical axis. Thus, the positional relationship between the optical element and the aperture stops can be kept constant, and as a result, the exposure accuracy of an exposure apparatus can be improved.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. An exposure apparatus that illuminates a mask with exposure light emitted along an optical axis from a light source of an illumination optical system for exposing a photosensitive substrate, the exposure apparatus comprising:

an optical element aligned with the optical axis, said optical element making uniform an intensity distribution of the exposure light;

a plurality of aperture stops interchangeably positioned facing said optical element; and an adjusting mechanism associated with said optical element and said plurality of aperture stops, said adjusting mechanism adjusting positions of said optical element and said plurality of aperture stops relative to each other and relative to the optical axis, wherein said adjusting mechanism is structured to keep constant a positional relationship between said optical element and one of said plurality of aperture stops in accordance with a position adjustment of said optical element.

2. An exposure apparatus according to claim 1, wherein said optical element comprises a fly-eye lens.

3. An exposure apparatus according to claim 1, wherein said plurality of aperture stops are formed in a rotatable plate disposed adjacent said optical element, the exposure apparatus further comprising a motor coupled with said rotatable plate for positioning said rotatable plate in accordance with a desired one of said aperture stops.

4. An exposure apparatus according to claim 1, wherein said positions adjusted by said adjusting mechanism comprise at least three degrees of freedom.

5. An exposure apparatus according to claim 4, wherein said positions adjusted by said adjusting mechanism comprise at least five degrees of freedom including along the optical axis, in directions perpendicular to the optical axis, and inclinations with respect to the optical axis.

6. An exposure apparatus according to claim 1, wherein said adjusting mechanism comprises:
   a first positioning unit coupled with said optical element, said first positioning unit including a first XYZ mechanism that adjusts X, Y and Z positions of said optical element and a first swing adjusting mechanism that adjusts an inclination of said optical element; and
   a second positioning unit coupled with said plurality of aperture stops, said second positioning unit including a second XYZ mechanism that adjusts X, Y and Z positions of said plurality of aperture stops and a second swing adjusting mechanism that adjusts an inclination of said plurality of aperture stops.

7. An exposure apparatus according to claim 6, wherein said first XYZ mechanism and said second XYZ mechanism are comprised of the same element.

8. An exposure apparatus according to claim 1, wherein said adjusting mechanism comprises:
   an XYZ mechanism coupled with said optical element and said plurality of aperture stops that adjusts X, Y and Z positions of said optical element and said plurality of aperture stops;
   a first swing adjusting mechanism coupled with said optical element and said first XYZ mechanism that adjusts an inclination of said optical element;
   an optical element holder coupled with said first XYZ mechanism and said first swing mechanism, said optical element holder supporting the optical element;
   a second swing adjusting mechanism that adjusts an inclination of said plurality of aperture stops; and
   a motor coupled with said second swing adjusting mechanism and having an output shaft, said plurality of aperture stops being fixed to said output shaft.

9. An exposure apparatus according to claim 8, wherein said XYZ mechanism comprises a first XYZ mechanism coupled with said optical element, said first XYZ mechanism independently adjusting X, Y and Z positions of said optical element, and a second XYZ mechanism coupled with said plurality of aperture stops, said second XYZ mechanism independently adjusting X, Y and Z positions of said plurality of aperture stops.

10. An exposure apparatus according to claim 1, wherein said adjusting mechanism supports said optical element and said plurality of aperture stops.

11. An adjustable holder mechanism for use with an exposure apparatus that illuminates a mask with exposure light emitted along an optical axis from a light source of an illumination optical system for exposing a photosensitive substrate, the exposure apparatus including an optical element for making uniform an intensity distribution of the exposure light and a plurality of aperture stops interchangeably positioned facing the optical element, the adjustable holder mechanism comprising:
   a first positioning unit coupled with the optical element, said first positioning unit adjusting positions of the optical element; and
   a second positioning unit coupled with the plurality of aperture stops, said second positioning unit adjusting positions of the plurality of aperture stops, wherein said first and second positioning units share at least one positioning part for adjusting positions of both the optical element and the plurality of aperture stops.

12. An adjustable holder mechanism according to claim 11, wherein said positions adjusted by said first and second positioning units comprise at least three degrees of freedom.

13. An adjustable holder mechanism according to claim 12, wherein said positions adjusted by said first and second positioning units comprise at least five degrees of freedom including along the optical axis, in directions perpendicular to the optical axis, and inclinations with respect to the optical axis.

14. An adjustable holder mechanism according to claim 11, wherein said first positioning unit comprises a first XYZ mechanism that adjusts X, Y and Z positions of the optical element and a first swing adjusting mechanism that adjusts an inclination of the optical element, and wherein said second positioning unit comprises a second XYZ mechanism that adjusts X, Y and Z positions of the plurality of aperture stops and a second swing adjusting mechanism that adjusts an inclination of the plurality of aperture stops.

15. An adjustable holder mechanism according to claim 14, wherein said first XYZ mechanism and said second XYZ mechanism are comprised of the same element.

16. An adjustable holder mechanism according to claim 11, wherein said first positioning unit comprises:
   an XYZ mechanism coupled with the optical element and the plurality of aperture stops that adjusts X, Y and Z positions of the optical element and the plurality of aperture stops;
   a first swing adjusting mechanism coupled with the optical element and the first XYZ mechanism that adjusts an inclination of the optical element; and
   an optical element holder coupled with said first XYZ mechanism and said first swing mechanism, said optical element holder supporting the optical element, and
   wherein said second positioning unit comprises:
      a second swing adjusting mechanism that adjusts an inclination of the plurality of aperture stops; and
      a motor coupled with said second swing adjusting mechanism and having an output shaft, the plurality of aperture stops being fixed to said output shaft.

17. An adjustable holder mechanism according to claim 16, wherein said XYZ mechanism comprises a first XYZ mechanism coupled with the optical element, said first XYZ mechanism independently adjusting X, Y and Z positions of the optical element, and a second XYZ mechanism coupled with the plurality of aperture stops, said second XYZ mechanism independently adjusting X, Y and Z positions of the plurality of aperture stops.

18. A method of operating an exposure apparatus that illuminates a mask with exposure light emitted along an optical axis from a light source of an illumination optical system for exposing a photosensitive substrate, the exposure apparatus including an optical element for making uniform an intensity distribution of the exposure light and a plurality of aperture stops interchangeably positioned facing the optical element, the method comprising:
   adjusting positions of the optical element and the plurality of aperture stops relative to each other and relative to the optical axis in accordance with predetermined parameters; and
   keeping constant a positional relationship between the optical element and the plurality of aperture stops in accordance with a position adjustment of the optical element.

19. A method according to claim 18, wherein said adjusting step comprises simultaneously adjusting X, Y and Z positions of the optical element and the plurality of aperture stops.

20. An exposure apparatus that illuminates a mask with exposure light emitted along an optical axis from a light source of an illumination optical system for exposing a photosensitive substrate, the exposure apparatus comprising:

an optical element aligned with the optical axis, said optical element making uniform an intensity distribution of the exposure light;

a plurality of aperture stops interchangeably positioned facing said optical element; and an adjusting mechanism associated with said optical element and said plurality of aperture stops, said adjusting mechanism adjusting positions of said optical element and said plurality of aperture stops relative to each other and relative to the optical axis, wherein said adjusting mechanism is structured to keep constant a positional relationship between said optical element and one of said plurality of aperture stops in accordance with a position adjustment of said optical element, wherein said adjusting mechanism comprises:

a first positioning unit coupled with said optical element, said first positioning unit adjusting positions of said optical element; and a second positioning unit coupled with said plurality of aperture stops, said second positioning unit adjusting positions of said plurality of aperture stops, wherein said first and second positioning units share at least one positioning part for adjusting positions of both said optical element and said plurality of aperture stops.

21. An exposure apparatus according to claim 20, wherein said optical element comprises a fly-eye lens.

22. An exposure apparatus according to claim 20, wherein said plurality of aperture stops are formed in a rotatable plate disposed adjacent said optical element, the exposure apparatus further comprising a motor coupled with said rotatable plate for positioning said rotatable plate in accordance with a desired one of said aperture stops.

23. An exposure apparatus according to claim 20, wherein said positions adjusted by said adjusting mechanism comprise at least three degrees of freedom.

24. An exposure apparatus according to claim 23, wherein said positions adjusted by said adjusting mechanism comprise at least five degrees of freedom including along the optical axis, in directions perpendicular to the optical axis, and inclinations with respect to the optical axis.

25. An exposure apparatus according to claim 20, wherein said adjusting mechanism comprises:

a first positioning unit coupled with said optical element, said first positioning unit including a first XYZ mechanism that adjusts X, Y and Z positions of said optical element and a first swing adjusting mechanism that adjusts an inclination of said optical element; and a second positioning unit coupled with said plurality of aperture stops, said second positioning unit including a second XYZ mechanism that adjusts X, Y and Z positions of said plurality of aperture stops and a second swing adjusting mechanism that adjusts an inclination of said plurality of aperture stops.

26. An exposure apparatus according to claim 25, wherein said first XYZ mechanism and said second XYZ mechanism are comprised of the same element.

27. An exposure apparatus according to claim 20, wherein said adjusting mechanism comprises:

an XYZ mechanism coupled with said optical element and said plurality of aperture stops that adjusts X, Y and Z positions of said optical element and said plurality of aperture stops;

a first swing adjusting mechanism coupled with said optical element and said first XYZ mechanism that adjusts an inclination of said optical element;

an optical element holder coupled with said first XYZ mechanism and said first swing mechanism, said optical element holder supporting the optical element;

a second swing adjusting mechanism that adjusts an inclination of said plurality of aperture stops; and a motor coupled with said second swing adjusting mechanism and having an output shaft, said plurality of aperture stops being fixed to said output shaft.

28. An exposure apparatus according to claim 27, wherein said XYZ mechanism comprises a first XYZ mechanism coupled with said optical element, said first XYZ mechanism independently adjusting X, Y and Z positions of said optical element, and a second XYZ mechanism coupled with said plurality of aperture stops, said second XYZ mechanism independently adjusting X, Y and Z positions of said plurality of aperture stops.

29. An exposure apparatus according to claim 20, wherein said adjusting mechanism supports said optical element and said plurality of aperture stops.

* * * * *